US010164670B2

(12) United States Patent
Dark et al.

(10) Patent No.: US 10,164,670 B2
(45) Date of Patent: *Dec. 25, 2018

(54) TIME SEQUENCED SPECTRAL STITCHING

(71) Applicant: NATIONAL INSTRUMENTS CORPORATION, Austin, TX (US)

(72) Inventors: Stephen L. Dark, Austin, TX (US); Christopher N. White, Cedar Park, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/692,596

(22) Filed: Aug. 31, 2017

(65) Prior Publication Data

US 2018/0069576 A1 Mar. 8, 2018

Related U.S. Application Data

(60) Provisional application No. 62/383,416, filed on Sep. 3, 2016.

(51) Int. Cl.
| | | |
|---|---|---|
| H04B 1/10 | (2006.01) | |
| H04L 7/00 | (2006.01) | |
| G01R 13/02 | (2006.01) | |
| H04L 25/02 | (2006.01) | |
| H04L 27/38 | (2006.01) | |

(52) U.S. Cl.
CPC ........... *H04B 1/10* (2013.01); *G01R 13/0272* (2013.01); *H04L 7/0029* (2013.01); *H04L 7/0041* (2013.01); *H04L 7/0087* (2013.01); *H04L 25/022* (2013.01); *H04L 27/3827* (2013.01)

(58) Field of Classification Search
CPC ....... H04B 1/10; H04L 7/0029; H04L 7/0041; H04L 7/0087; H04L 27/3827
See application file for complete search history.

(56) References Cited

U.S. PATENT DOCUMENTS 5,949,796 A * 9/1999 Kumar .................. H04H 20/22
370/487
7,957,938 B2 6/2011 LaMarche
(Continued)

OTHER PUBLICATIONS

Bensmida, Souheil; Hammi, Oualid; Kwan, Andrew; Sharawi, Mohammad S.; Morris, Kevin A.; Ghannouchi, Fadhel M.—"Extending the Characterization Bandwidth of Dynamic Nonlinear Transmitters with Application to Digital Predistortion"—IEEE Transactions on Microwave Theory and Techniques—Aug. 2016; pp. 2640-2651; vol. 64, Issue 8—(14 pages).

*Primary Examiner* — Janice N Tieu
(74) *Attorney, Agent, or Firm* — Meyertons Hood Kivlin Kowert & Goetzel, P.C.; Jeffrey C. Hood; Matthew C. Washburn

(57) ABSTRACT

Methods and systems are disclosed for using a single receiving device, such as a single VSA, to capture and digitize multiple time-domain acquisitions of a repeating signal at different center frequencies, to create a single time-domain waveform having a bandwidth greater than the real-time instantaneous bandwidth of the receiving device. Specifically, one or more signal processing paths may process the multiple digitized acquisitions of the repeating signal, either sequentially or in parallel, such that the processed acquisitions may be aggregated into a representation of one or more repetitions of the repeating signal.

20 Claims, 6 Drawing Sheets

(56) References Cited

U.S. PATENT DOCUMENTS

| | | |
|---|---|---|
| 2003/0153273 A1 | 8/2003 | Ebert |
| 2007/0236230 A1 | 10/2007 | Tanbakuchi |
| 2011/0140942 A1 | 6/2011 | Pagnanelli |
| 2012/0287871 A1 | 11/2012 | Marini |
| 2013/0110442 A1 | 5/2013 | Nishimura |
| 2013/0114588 A1* | 5/2013 | Kyperountas ........ H04B 1/0064 370/345 |
| 2013/0343490 A1 | 12/2013 | Wertz |
| 2014/0024315 A1 | 1/2014 | Olgaard |
| 2014/0241410 A1 | 8/2014 | Dark |
| 2015/0061911 A1 | 3/2015 | Pagnanelli |

\* cited by examiner

TIME SEQUENCED SPECTRAL STITCHING

PRIORITY INFORMATION

This application claims priority to U.S. provisional patent application Ser. No. 62/383,416, titled "Time Sequenced Spectral Stitching," by Stephen L. Dark, filed Sep. 3, 2016, which is hereby incorporated by reference in its entirety as though fully and completely set forth herein.

FIELD OF THE INVENTION

The present invention relates to the field of signal processing, and more particularly to systems and methods for increasing instantaneous bandwidth in a vector signal analyzer.

DESCRIPTION OF THE RELATED ART

Instantaneous bandwidth is an important banner specification for all radio frequency (RF) vector signal analyzers (VSAs) and RF vector signal generators (VSGs). The desire of the industry is to increase the bandwidth as much as possible without sacrificing dynamic range. In many cases, the limiting factor in achieving the largest possible bandwidth is the sample rate of the analog-to-digital converters (ADCs) and digital-to-analog converters (DACs). While ADC and DAC vendors are always working to increase the converter rates, there still exists a desire in many applications for bandwidths that exceed the capabilities of state-of-the-art ADCs and DACs. In addition, it is often difficult to predict the needs of the market with enough warning to develop the needed products with the desired instantaneous bandwidth. There are several different methods within the industry for achieving larger bandwidths, each with their own disadvantages.

U.S. Pat. No. 9,326,174 describes processes for spectral stitching in vector signal analyzers where higher instantaneous bandwidths are achieved by aggregating multiple VSAs together. However, utilizing multiple VSAs may be cost prohibitive in some applications.

There are also two common non-real-time methods present in the industry to increase the bandwidth of a device. The first method is found in sampling oscilloscopes (not to be confused with real-time oscilloscopes that acquire digital samples). The sampling oscilloscope is a device that has a very fast (high bandwidth) front end sample and hold circuit followed by an ADC with a low sample rate. It is common for the sample and hold circuit to be integrated within the ADC. In the case of sampling oscilloscopes, the sample and hold circuit and the ADC sample at the same rate, where both are sampling slower than the rate needed to acquire a signal with the bandwidth of the sample and hold circuit (undersampling). In order to circumvent this limitation, sampling oscilloscopes sample the same signal multiple times, at different offset positions in time with respect to the beginning of the signal. Once the same signal has been acquired enough times using enough time offsets, the samples from the multiple captures are reassembled back together to create a single waveform at an effective sample rate high enough to encompass the bandwidth of the signal of interest. This method often makes sampling oscilloscopes the most economical method for sampling very high bandwidth signals where the signal may be repeated consistently. However, this method has the limitation that it cannot, by itself, sample an arbitrary band of interest. Rather, it samples the band located between DC (0 Hz) and its max bandwidth. This results in significant wasted sampling outside the band of interest. In summary, the method implemented by a sampling oscilloscope may be classified as a time domain non-real-time algorithm for increasing instantaneous bandwidth.

The second common method is known as "spectrum aggregation" or "spectrum stitching" (not to be confused with the "spectral stitching" described in U.S. Pat. No. 9,326,174). Spectrum aggregation takes multiple captures of the same repetitive signal at multiple different center frequencies. The magnitude response is computed for each capture, and the different frequency domain spectrums (with different center frequencies) are concatenated together to form a composite signal. Traditional swept tune spectrum analyzers fit within this category. While various implementations exist, the shared basic idea is that the power of the signal is calculated within a given bandwidth, and the center frequency of the analyzer is tuned to span the bandwidth of the signal of interest. While spectrum aggregation can result in creating a magnitude response spectrum of the signal of interest, it does not retain phase information that can be demodulated.

Thus, there exists a need for mechanisms capable of presenting larger instantaneous or modulation bandwidths, including both magnitude and phase information, from a (relatively inexpensive) device capable of sampling smaller bandwidths, without the significant wasted sampling of known methods.

SUMMARY

Methods and systems are disclosed for using multiple time-domain acquisitions at different center frequencies from a single receiving device (e.g., a single VSA) to create a single time-domain waveform of larger bandwidth.

A method is presented for representing a finite time period of a frequency band of interest of a repeating received signal. A plurality of frequency subsets of the frequency band of interest may be digitized, each subset having a respective center frequency with a respective frequency offset from a center frequency of the frequency band of interest, and each subset having at least one overlap portion constituting a region of frequency overlap with another subset. The digitizing may include a receiving device digitizing each subset sequentially, based on a respective repetition of the received signal to generate a respective digitized component signal. The digitized component signals may be summed to obtain a composite signal having a composite frequency band. The frequency response of the digitized component signals may be shaped, prior to the summing, such that a sum of the digitized component signals produced by the summing approximates an output that would be achieved by digitizing the entire frequency band of interest using a single receiving device having a flat frequency response across an entire frequency band of interest. One or more of the digitized component signals may be frequency-shifted, prior to the summing, by the respective frequency offset of the respective subset of the frequency band of interest.

In some scenarios, prior to the summing, at least one of gain, phase, and time delay of one or more of the digitized component signals may be adjusted such that the sum of the digitized component signals has a continuous frequency response over the composite frequency band. In some scenarios, adjusting the time delay of one or more of the digitized component signals may include determining a time offset between two or more of the digitized component signals by correlating instantaneous power signatures of the two or more of the digitized component signals.

In some scenarios, prior to the summing, the digitized component signals may be interpolated to at least a Nyquist rate of the digitized component signals.

In some scenarios, the shaping and frequency-shifting may be performed for each digitized component signal sequentially. The shaped, frequency-shifted digitized component signals may be stored until the stored digitized component signals represent the entire frequency band of interest. Summing the digitized component signals may include summing the stored digitized component signals representing the entire frequency band of interest.

In some scenarios, a plurality of digitized component signals may be stored. The shaping and frequency-shifting for the stored plurality of digitized component signals may be performed in parallel, using a plurality of signal processing paths.

In some scenarios, the digitized component signals may be aligned in time by beginning the digitizing of each frequency subset at a fixed time relative to a repetition of the received signal.

Systems are also disclosed for performing methods such as those outlined above.

This summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present inventions can be obtained when the following detailed description is considered in conjunction with the following drawings.

Figure 1:
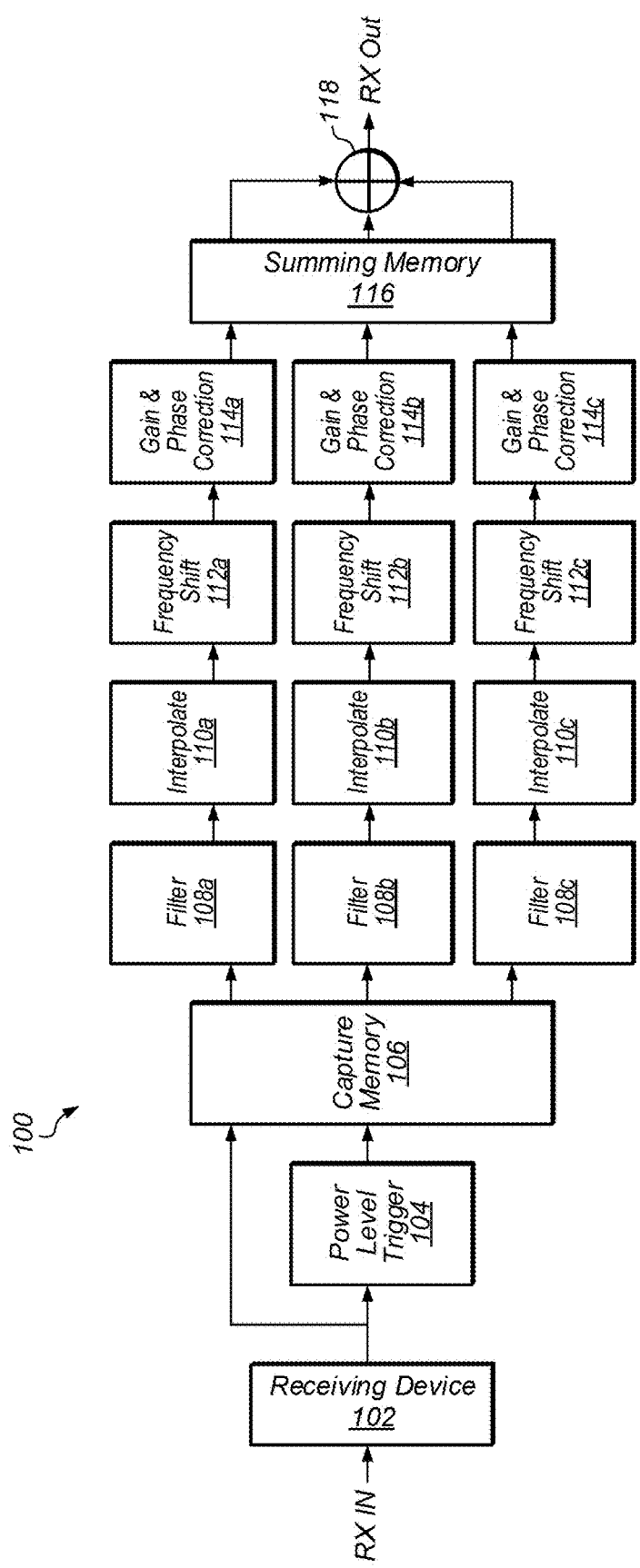
FIG. 1 is a block diagram illustrating an embodiment of a system for performing time sequenced spectral stitching in a signal path receiving an analog signal, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note that the various section headings in the following Detailed Description are for organizational purposes only and are not meant to be used to limit the claims.

DETAILED DESCRIPTION

Incorporation by Reference

The following reference is incorporated by reference as if fully and completely disclosed herein:

U.S. Pat. No. 9,326,174, issued on Apr. 26, 2016, entitled "Spectral Stitching Method to Increase Instantaneous Bandwidth in Vector Signal Analyzers", invented by Stephen L. Dark et al.

Terminology

The following is a glossary of terms used in the present application:

Memory Medium—Any of various types of memory devices or storage devices. The term "memory medium" is intended to include an installation medium, e.g., a CD-ROM, floppy disks 105, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Local Oscillator (LO)—a circuit configured to generate a periodic signal at a specified frequency and amplitude. The periodic signal may be a pure sinusoid, and its frequency and/or amplitude may be programmable. The periodic signal may or may not be phase or frequency locked to another periodic signal.

Overview

Time interleaving uses time as the mechanism to increase the bandwidth while quadrature mixing uses phase as its mechanism. The present "spectral stitching" approach uses frequency as its mechanism to achieve larger instantaneous bandwidths in a signal receiver, such as an RF (radio frequency) receiver. As used herein, the term "RF" is intended to include the full spectrum of communication frequencies, and includes at least radio and microwave frequencies.

In a setting in which the received signal consistently repeats in time, such as a development and testing setting, the concepts of spectral stitching may be applied using a single receiving device, such as a vector signal analyzer (VSA), which may sample a different subset of the frequency band of interest in each of a plurality of repetitions of the signal, and may then aggregate (or "stitch") the samples together as a single representation of one repetition of the signal. This enables a given hardware device the ability to capture and return the time domain data of an input signal that has greater instantaneous bandwidth than the real-time instantaneous bandwidth of the hardware device.

Because this method does not require multiple parallel receiving devices (e.g., multiple VSAs), it may provide a solution to capturing IQ data waveforms of large instantaneous bandwidth with lower cost, space, and power requirements than existing solutions. One example application is in testing waveforms of next-generation communication standards (e.g., 802.11ay). Developers commonly work on developing hardware for communication standards that have not yet been finalized. Such standards often have greater bandwidth requirements than previous-generation standards, for which the developer's current test hardware was designed. It would therefore be advantageous for such developers to be able to leverage their current test hardware to capture instantaneous bandwidths exceeding the real-time bandwidths of the current test hardware, e.g., to avoid the expense of acquiring new test hardware that is custom-designed for a standard that has not yet been finalized.

Embodiments of the present invention may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computer system may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The computer system may be realized in any of various forms. For example, the computer system may be a personal computer (in any of its various realizations), a workstation, a computer on a card, an application-specific computer in a box, a server computer, a client computer, a hand-held device, a tablet computer, a wearable computer, etc.

FIG. 1—Time Sequenced Spectral Stitching System

In a receive path, a system may use multiple time-domain acquisitions at different center frequencies from a single receiving device (e.g., a single VSA) to create a single time-domain waveform of larger bandwidth. While this process is not real-time, it may still create the time-domain waveform needed to demodulate the signal of interest as though it was captured by a single device with the necessary bandwidth.

FIG. 1 illustrates a block diagram of an embodiment of a system 100 for performing time sequenced spectral stitching in a signal path receiving an analog signal RX IN, according to some embodiments. The analog signal RX IN may be a repeating (e.g. cyclic) signal; i.e., the signal may repeat in time. Although each repetition (e.g., cycle) may vary slightly, e.g., due to interference or other variation in the transmission medium or signal source, the repetitions should be sufficiently similar as to reliably represent the same significant characteristics of the received signal. The degree of similarity required may vary between applications, e.g., depending upon the signal characteristics that are significant for the applications. The analog signal RX IN may be received from any of a variety of sources, such as a vector signal generator (VSG) or a radio receiver. The analog signal RX IN may include a frequency band of interest that is to be digitized. E.g., a goal of the system 100 may be to digitize at least one repetition of the frequency band of interest of the analog signal RX IN with sufficient detail to allow recovery of data encoded on the signal.

Figure 2A:
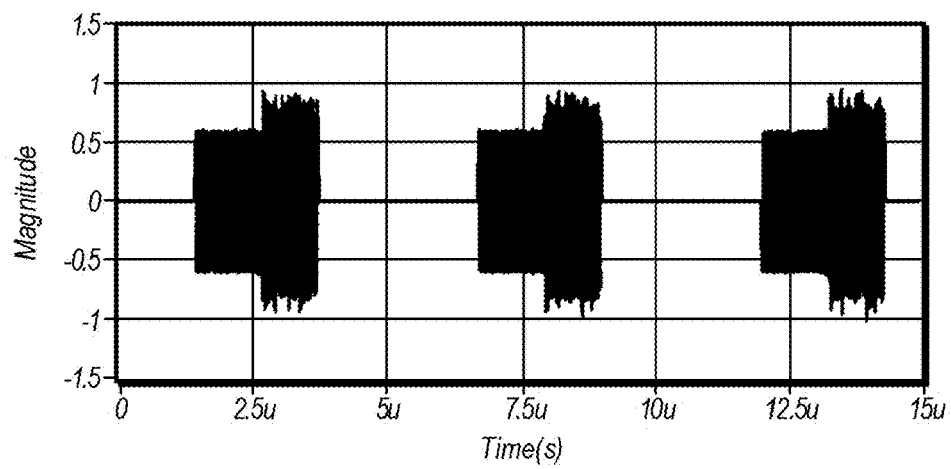
FIG. 2a illustrates a time domain representation of an example input signal, according to some embodiments.
Figure 2B:
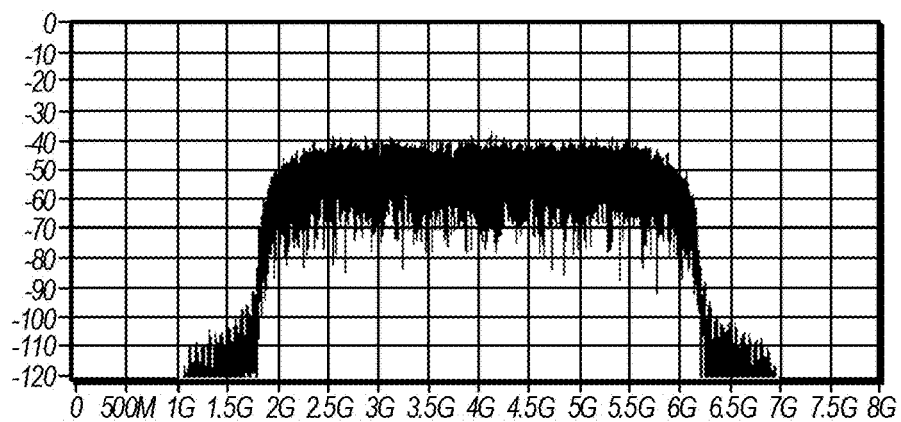
FIG. 2b illustrates a frequency domain representation of the example input signal of FIG. 2a, according to some embodiments.
Figure 2C:
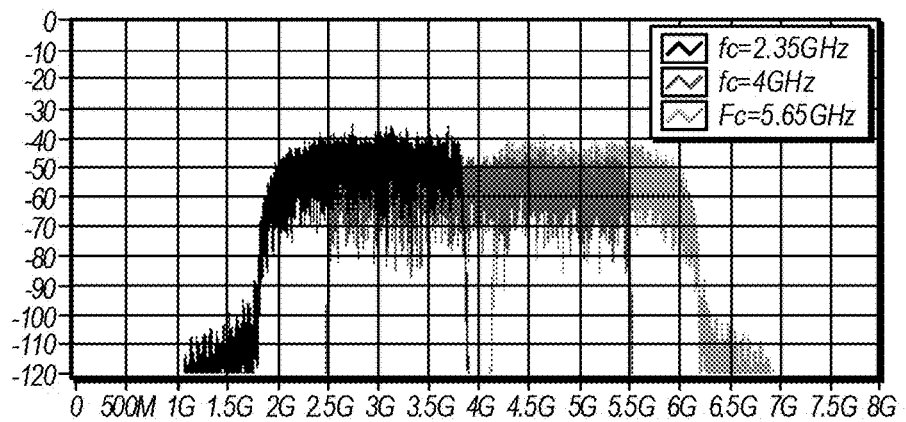
FIG. 2c illustrates a frequency domain representation of the example input signal of FIG. 2b, divided into multiple subsets of the frequency band of the signal, according to some embodiments.

FIG. 2a illustrates a time domain representation of an example signal RX IN, which can be seen to be a repeating signal. FIG. 2b illustrates a frequency domain representation of the example signal RX IN, illustrated as a 4.4 GHz signal centered at 4 GHz. In order to capture this signal with a single device that has an instantaneous bandwidth smaller than 4 GHz (e.g., 2 GHz), the system 100 may make multiple captures, e.g., at 2.35 GHz, 4 GHz, and 5.65 GHz center frequencies, as shown in FIG. 2b. Each capture may include a subset of the frequency band of the signal RX IN.

For example, as illustrated in FIG. 1, a receiving device 102 may receive the analog signal RX IN. The receiving device 102 may include any device capable of (or configured to) receiving and digitizing the analog input signal at a specified center frequency. For example, the receiving device 102 may include a VSA, RF receiver, digitizer, or other device. The receiving device 102 may have a maximum instantaneous bandwidth that is less than the frequency band of interest of the received signal RX IN. The receiving device 102 may therefore digitize a first subset of the frequency band of interest, wherein the first subset of the frequency band of interest has a bandwidth that is less than or equal to the maximum instantaneous bandwidth of the receiving device 102.

The digitizing performed by the receiving device 102 may include performing I/Q demodulation on the signal to be digitized (e.g., on the first subset of the frequency band of interest) to produce a pair of analog I (in-phase) and Q (quadrature) signals. The digitizing may further include frequency-shifting the signal to be digitized (or the I/Q signal pair) such that the center frequency of the signal to be digitized is shifted to baseband. The receiving device 102 may then filter out portions of the shifted signal that are outside the signal to be digitized (e.g., the first subset of the frequency band of interest), e.g. by using a low-pass filter. Alternatively, the receiving device 102 may frequency-shift the received signal to be digitized to a position other than baseband (or forego frequency-shifting), and filter the shifted signal using a band-pass filter.

In some embodiments, a local oscillator (LO) of the receiving device 102 may be configured to operate at a center frequency of the signal to be digitized (e.g., the first subset of the frequency band of interest). The LO may be used, for example, in frequency-shifting the center frequency to baseband.

The digitizing may further include complex sampling the filtered signal, as known in the art. The receiving device 102 may output a complex (I/Q) signal representing a digitized component signal of the frequency band of interest of the received signal RX IN. Specifically, when digitizing the first subset of the frequency band of interest, the receiving device 102 may output a first digitized component signal of the frequency band of interest. The receiving device 102 may continue to digitize the first subset of the frequency band of interest for a duration of time including at least one repetition of the received signal RX IN.

The first digitized component signal may be stored in the capture memory 106. The capture memory 106 may be configured to store a plurality of digitized component signals, each having a length of at least one repetition of the received signal RX IN. Viewed another way, the analog signal RX IN should have a repetition length sufficiently short that a plurality of digitized component signals may fit within the capture memory 106.

Once the receiving device 102 has digitized the first subset of the frequency band of interest for at least one repetition, the receiving device 102 may similarly digitize a second, different subset of the frequency band of interest, resulting in a second digitized component signal, which may also be stored in the capture memory 106. For example, the LO of the receiving device 102 may be reconfigured to operate at a center frequency of the second subset of the frequency band of interest. The second subset of the frequency band of interest may have a region of frequency overlap with the first frequency band of interest. The receiving device 102 may continue to digitize the second subset of the frequency band of interest for a duration of time including at least one repetition of the received signal RX IN. Thus, the first subset of the frequency band of interest may be digitized based on a first repetition of the received signal, to generate the first digitized component signal, and the second subset of the frequency band of interest may be digitized based on a second repetition of the received signal RX IN, to generate the second digitized component signal.

Once the receiving device 102 has digitized the second subset of the frequency band of interest for at least one repetition, the receiving device 102 may similarly digitize zero or more additional subsets of the frequency band of interest, each subset being digitized based on a respective repetition of the received signal RX IN, and each subset having a region of frequency overlap with at least one other subset, until the entire frequency band of interest has been digitized. Each of the resulting digitized component signals may be stored in the capture memory 106.

Figure 3:
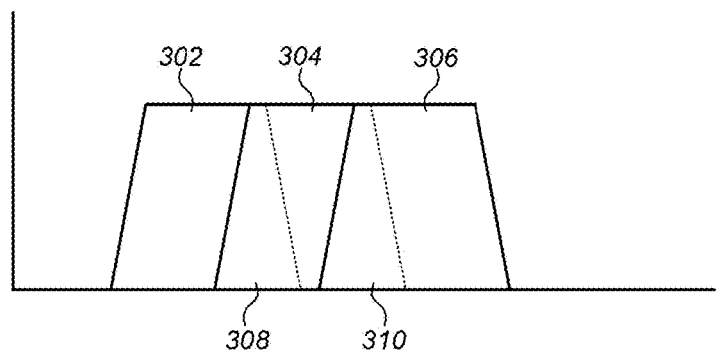
FIG. 3 illustrates an exemplary embodiment of respective frequency bands within an aggregate frequency band.

FIG. 3 illustrates an exemplary embodiment of three subsets of the frequency band of interest of the received signal RX IN, represented in the frequency domain. In this example, frequency band 302 represents the first subset of the frequency band of interest, frequency band 304 represents the second subset, and frequency band 306 represents the third subset. The region covered by frequency bands 302-306 together represents the frequency band of interest (or "aggregate frequency band"), and has an associated aggregate center frequency. A respective center frequency of each subset of the frequency band of interest is offset from the aggregate center frequency by a respective frequency offset. In some circumstances, a respective center frequency may be offset from the aggregate center frequency by 0 Hz, as in the example of frequency band 304.

The frequency bands overlap to avoid gaps within the frequency band of interest. For example, the region 308 represents a region of overlap between frequency band 302 and frequency band 304 (i.e. between the first subset and the second subset), and the region 310 represents the region of overlap between frequency band 304 and frequency band 306 (i.e. between the second subset and the third subset).

Once all portions of the frequency band of interest have been digitized (included in at least one of the digitized component signals), the digitized component signals may be summed ("stitched") together, e.g., by a summing unit 118, to form a composite signal representing a digitized version of at least one repetition of the received signal RX IN. The composite signal may have a composite frequency band corresponding to the frequency band of interest (although the composite frequency band may, in some embodiments, be translated to, or near, baseband).

Because each digitized component signal stored in the capture memory 106 represents a different, overlapping frequency band of the received signal RX IN (i.e., a different subset of the frequency band of interest), merely summing the digitized component signals will not yield a continuous representation of the received signal RX IN. Further, because each digitized component signal is based on a different repetition of the received signal RX IN, some variations may be present between the respective digitized component signals, e.g., because of time variations between repetitions of the received signal RX IN or within the receiving device 102. Thus, in order for the sum of the digitized component signals to accurately represent a digitized version of the frequency band of interest of the received signal RX IN, the digitized component signals may be further processed to provide continuity through their regions of overlap.

FIG. 1 illustrates a plurality of signal processing paths (108-114) for further processing the plurality of digitized component signals. As shown in FIG. 1, the system 100 includes three signal paths (a-c). Other embodiments may include another number N of signal paths. For example, in some embodiments, the system 100 may include a respective parallel signal path for each of the plurality of digitized component signals. In other embodiments, the system 100 may include only one signal path, configured to process each digitized component signal in sequence, and storing the output of gain and phase correction block 114 (as described below) for each digitized signal, e.g., in a memory or buffer, such as the summing memory 116. In such embodiments, the capture memory 106 may be omitted, as each digitized component signal may be processed in real time as it is output by the receiving device 102. In yet other embodiments, a combination of the preceding methods may be used, in which the system 100 includes a plurality N of signal processing paths, where N is smaller than a number M of digitized component signals. In such embodiments, a set of up to N digitized component signals may be processed in parallel, and one or more additional sets of up to N digitized component signals may be subsequently processed, with each processed digitized component signal stored in the summing memory 116. This may be useful, e.g., where a signal processing path cannot process a digitized component signal in real time.

At filter blocks 108a-c, the respective digitized component signals may be filtered. Specifically, the filter blocks 108a-c may shape the frequency response of the respective digitized component signals. Because the respective subsets of the frequency band of interest overlap in frequency, as shown in FIG. 3, the overlap regions should be shaped (e.g., filtered) to prevent power spikes, or other artificial increases in magnitude, in the overlap regions when the respective signals are summed by summing unit 118. In other words, the respective component signals should be filtered such that their sum appears continuous. Specifically, the filters 108a-c may be configured to provide a unity frequency response at all points within the composite frequency band, despite regions of overlap. For example, one or more of the filter blocks 108a-c may be configured to filter a first digitized component signal in a manner that is complementary to the filtering of a second digitized component signal, such that a sum of the first and second digitized component signals appears continuous across a region of overlap between the first and second digitized component signals. In other words, the filter blocks 108a-c may be configured to filter the respective digitized component signals such that the system as a whole exhibits a substantially flat frequency response across the entire frequency band of interest, and particularly across the overlap regions. More generally, this continuous-sum filtering may be configured in any manner such that the summed signals approximate the frequency response of the result that would be achieved if the entire frequency band of interest had been digitized by a single receiving device having sufficient bandwidth to digitize the entire frequency band of interest, e.g., the single receiving device having a substantially flat frequency response across the entire frequency band of interest.

Figure 4:
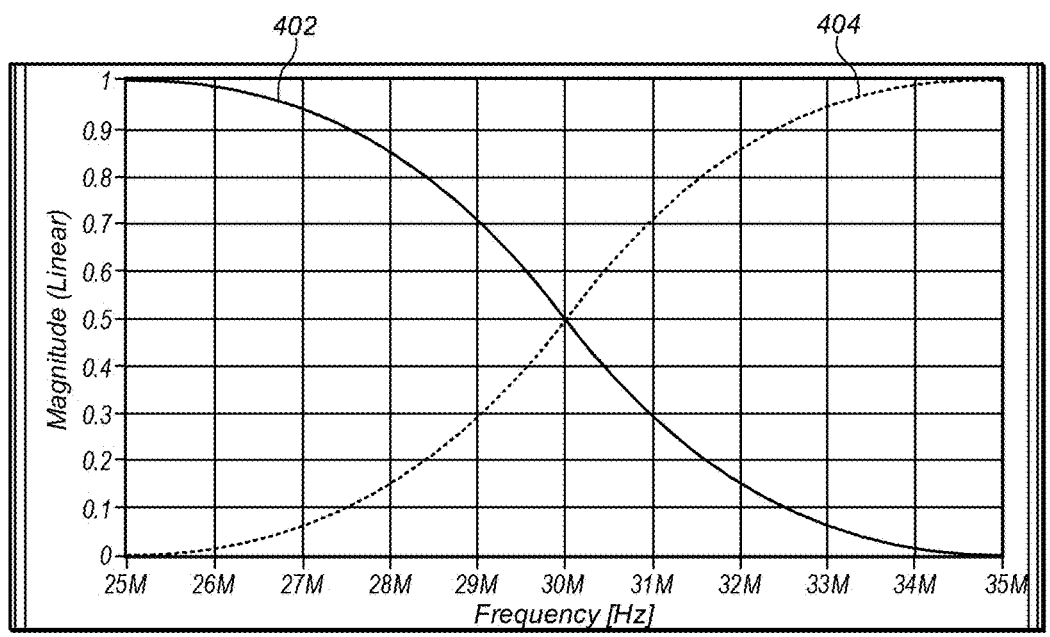
FIG. 4 illustrates the signal response of a half-band filter.

Various filter shapes may be used to accomplish this. For example, FIG. 4 illustrates the response of a half-band filter, where the solid trace 402 represents a filter response for a first filter block (e.g., 108a), configured to process a first digitized component signal, and the dotted trace 404 represents a filter response for a second filter block (e.g., 108b), configured to process a second digitized component signal, with a frequency band overlapping the frequency band of the first digitized component signal. In FIG. 4, the crossover point is located at 30 MHz, where there is a 10 MHz crossover region. While a half-band filter inherently has the needed spectral characteristics to filter overlapping frequency bands to sum together to produce unity gain, it forces the crossover point to occur at the sampling frequency divided by four, fs/4. In other embodiments, this crossover may be moved further out in frequency using other filter methods, e.g., to increase the effectiveness of the natural instantaneous bandwidth of each device.

The filtering illustrated as filter blocks 108a-c may happen at any of various points in the signal processing paths. For example, the filtering may occur after the interpolate blocks 110a-c. Alternatively, some embodiments may perform the filtering of the filter blocks 108a-c within the receiving device 102, e.g., concurrently with the low-pass filtering of the receiving device 102. In this case, the filtering may be performed by an analog filter prior to complex sampling of the filtered signal.

At interpolate blocks 110a-c, each digitized component signal may be interpolated. The interpolation factor may be set such that each respective interpolate block 206 interpolates the respective component signal to at least the effective I/Q rate required for the "stitched" data's bandwidth. For example, in one embodiment, the effective I/Q rate may be required to be at least the Nyquist rate of the digitized component signal. In another embodiment, a higher rate (e.g., 1.25 times the Nyquist rate) may be selected.

At frequency shift blocks 112a-c, each digitized component signal may be shifted into the proper location in frequency relative to the other digitized component signals. As a result, each data path will frequency shift its interpolated spectrum to a different location. Specifically, each digitized component signal may be shifted such that its respective center frequency is offset from baseband by the respective frequency offset by which it was originally offset from the aggregate center frequency. Thus, the entire aggregate frequency band may be frequency shifted to center at baseband.

For example, in the case that there are three digitized component signals, each filtered using half-band filters with an FQ rate of 120 MHz, then the cross-over points will be located at positive and negative 30 MHz. This means that the three respective center frequencies may be shifted to [−60 MHz, 0 Hz, 60 MHz]. Thus, the subsets of the frequency band of interest should be defined such that the respective frequency offsets are [−60 MHz, 0 Hz, 60 MHz] relative to the aggregate center frequency.

If the receiving device 102 previously shifted the respective center frequencies to baseband, then the frequency shift block 112a may, in this example, frequency shift its spectrum to the left by 60 MHz, the frequency shift block 112b may shift by 0 Hz, and the frequency shift block 112c may frequency shift its spectrum to the right by 60 MHz. In other words, each respective center frequency may be shifted by its respective frequency offset. In embodiments in which the respective frequencies were shifted by the receiving device 102 to a frequency other than baseband, then the respective center frequencies may be shifted by some value other than the respective frequency offsets.

At the gain and phase correction blocks 114a-c, the magnitude and phase of one or more of the digitized component signals may be adjusted to make the spectrum continuous through the regions of overlap. This gain and phase correction may include, e.g., a complex multiply of each of one or more of the digitized component signals with a respective calibration constant. Determining a calibration constant for each of the gain and phase correction blocks 114a-c is discussed below. In some embodiments, the gain and phase correction blocks 114a-c may be further configured to measure and correct the delay.

Once the digitized signals have all been processed, the processed signals may be summed. For example, the output of each gain and phase correction block 114a-c (or from summing memory 116, in embodiments including that component) may be provided to summing unit 118. The output of the summing unit 118 is a composite digital signal representing a digitized version of a finite time period (at least one repetition) of the frequency band of interest of the received signal RX IN. This composite digital signal may be decoded, or otherwise analyzed or further processed.

Determining Calibration Constants

Figure 5:
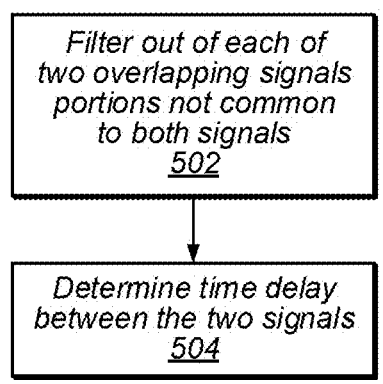
FIG. 5 illustrates a flow chart for an example method for determining calibration constants, according to some embodiments.

In order to adjust the magnitudes, phases, and/or time skews of the respective signals in the receive path to provide continuity through the regions of overlap, calibration constants may be determined, e.g., based on relative magnitudes, phases, and/or time skews between the digitized component signals without adjustment. For example, measurements may be performed and compared for each of two digitized component signals within a region of overlap. This may be repeated for each region of overlap. FIG. 5 illustrates an example method for determining calibration constants. The method of FIG. 5 may be performed by the system 100, e.g., by the gain and phase correction blocks 114a-c.

At 502, the system 100 may filter out, from each of two overlapping digital component signals, any part of the digital component signal that is not common to the two digital component signals.

At 504, the system 100 may determine the time delay between the two digital component signals, e.g., relative to the start of the respective repetitions of the input signal RX IN upon which each of the two digital component signals was based. Depending on the signal, there are multiple ways to make this determination. A first method includes identifying some common characteristic of the signal. For example, many communication signals have a region of low/no power, where the signal is inactive, followed by a region of power where the signal is active. The example signal of FIG. 2a is such a signal. The system 100 may identify the beginning of power in each repetition of the signal to achieve a common time reference between multiple signal captures. For example, the system 100 may include a power level trigger 104 configured to identify the beginning of power in each repetition of the signal. Finding the delta between this common time reference in the signal will provide the time skew information. Additionally, the system 100 may trigger off of the power of the waveform, such that all waveforms have a common start time. Assuming the trigger is perfectly accurate, this may remove the need for time skew adjustment. However, if the trigger is not sufficiently accurate for a given application, some small adjustment may still be performed.

A second method includes identifying instantaneous power of each of the two digital component signals, and correlating the digital component signals by matching instantaneous power signatures. For example, a peak in correlation may determine a location of the signal within each capture. Once the location has been determined, a relative measurement of the signal time offset may be determined.

For any signal-based calibration to be performed, some non-zero portion of the signal should be present in the overlap region, although some zero portion of the signal may also be present in the overlap region. To mitigate this issue for many types of signals, an understanding of the magnitude response can first be gained from the prior art "Spectrum Aggregation" method that can be used to develop a frequency plan that insures that the crossover regions have frequency content.

Figure 6A:
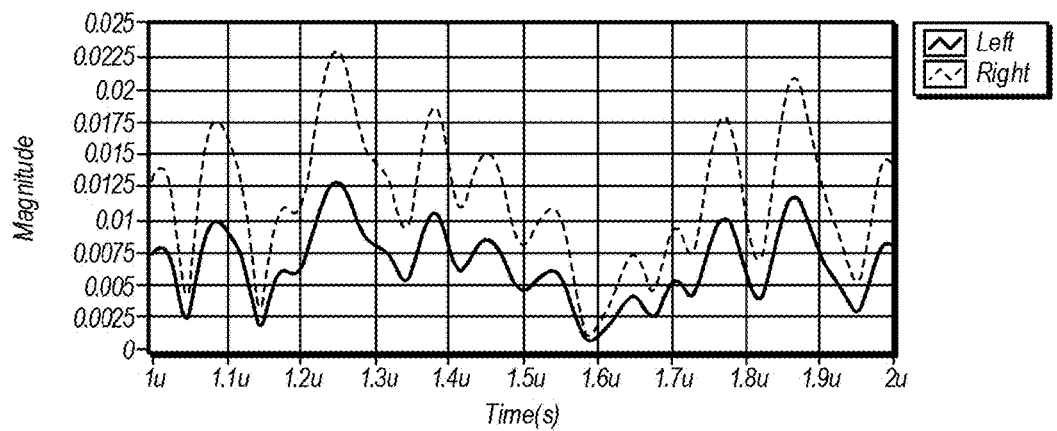
FIG. 6a illustrates magnitude responses of two digitized component signals, according to some embodiments.
Figure 6B:
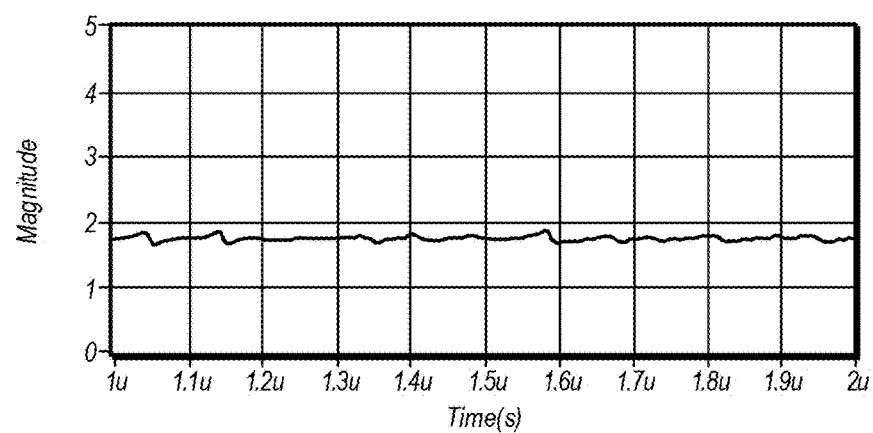
FIG. 6b illustrates calculated relative difference in magnitude between the two digitized component signals of FIG. 6a, according to some embodiments.
Figure 6C:
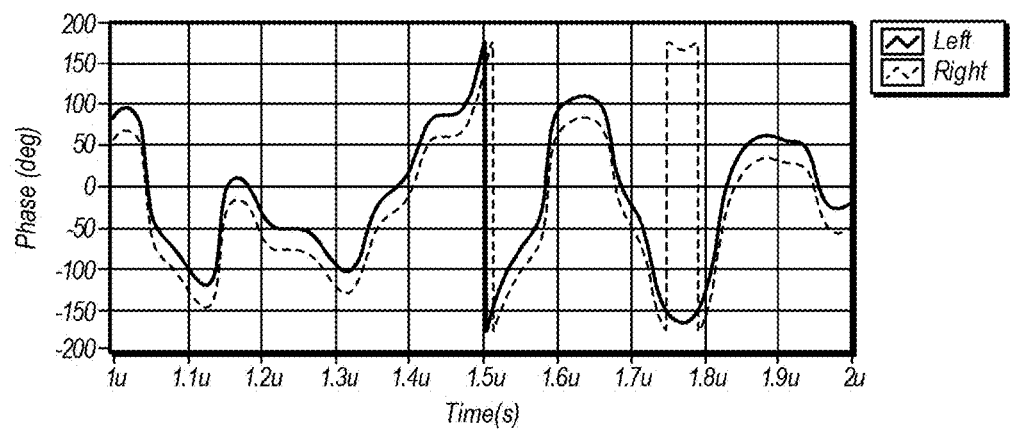
FIG. 6c illustrates phase responses of two digitized component signals, according to some embodiments.
Figure 6D:
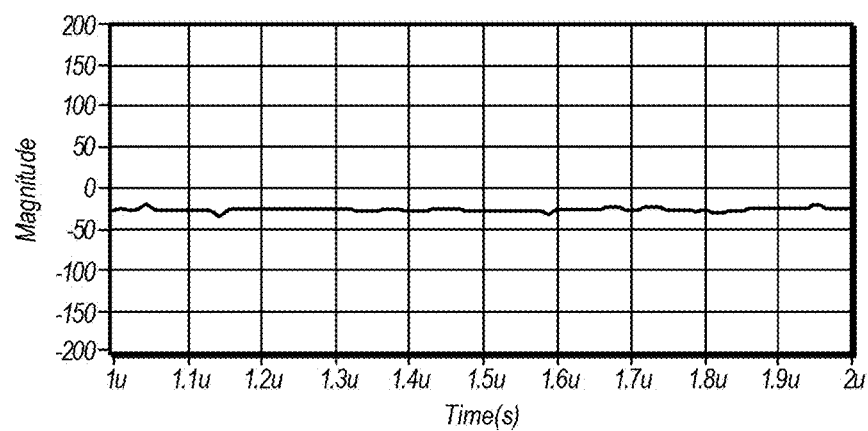
FIG. 6d illustrates calculated relative difference in phase between the two digitized component signals of FIG. 6c, according to some embodiments.

With the time delay understood, the magnitude and phase of the cross over region may be determined. One exemplary way to determine the magnitude and phase constants is to simply compare the magnitude and phase between the two captures. For example, FIG. 6a shows magnitude responses of two captures within the overlap region. FIG. 6b illustrates the calculated relative difference in magnitude between the two captures in the overlap region. As can be seen, the magnitude of each capture in the time-domain is off by a near constant amount through the time span of the waveform of interest. The same can be done for phase; the instantaneous phase of each capture can be computed across the captured samples of the signal of interest and then compared, as shown in FIG. 6c and FIG. 6d, which illustrate that the phase is off by a constant amount across all samples in time. From these figures, it can be seen that the relative magnitude and phase are mostly constant. Due to imperfections in the system and numerical precision, the relative magnitude and phase will not be perfectly constant. Generally, averaging all of the measurements may result in a reliably accurate understanding of the relative magnitude and phase. In addition, the average may be weighted so that more emphasis is given to data of higher amplitudes, so that the effect of noise is diminished.

These calibrations may be repeated as desired, depending on hardware capabilities. In most cases, the magnitude calibration may not need to be repeated since it will likely remain stable with time. However, the phase and time-delay calibration may need to be repeated more frequently. For example, if the signal can be determined using a power trigger, then time delay measurements may not need to be repeated. Additionally, if the LO phase of the receiving device 102 can be synchronized with the beginning of the waveform, phase calibration may not need to be repeated.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for representing a finite time period of a frequency band of interest of a repeating received signal, the method comprising:
   digitizing a plurality of frequency subsets of the frequency band of interest, each frequency subset having a respective center frequency with a respective frequency offset from a center frequency of the frequency band of interest, and each frequency subset having at least one overlap portion constituting a region of frequency overlap with another frequency subset, wherein the digitizing comprises a receiving device digitizing each frequency subset sequentially, based on a respective repetition of the received signal to generate a respective digitized component signal;
   summing the digitized component signals to obtain a composite signal having a composite frequency band;
   shaping the frequency response of the digitized component signals, prior to the summing, such that a sum of the digitized component signals produced by the summing approximates the frequency response of an output that would be achieved by digitizing the entire frequency band of interest using a single receiving device across an entire frequency band of interest; and
   frequency-shifting one or more of the digitized component signals, prior to the summing, by the respective frequency offset of the respective subset of the frequency band of interest.

2. The method of claim 1, further comprising:
   adjusting, prior to the summing, at least one of gain, phase, and time delay of one or more of the digitized component signals such that the sum of the digitized component signals has a continuous frequency response over the composite frequency band.

3. The method of claim 2, wherein adjusting the time delay of one or more of the digitized component signals comprises determining a time offset between two or more of the digitized component signals by correlating instantaneous power signatures of the two or more of the digitized component signals.

4. The method of claim 1, further comprising:
interpolating, prior to the summing, the digitized component signals to at least a Nyquist rate of the digitized component signals.

5. The method of claim 1, wherein the shaping and frequency-shifting are performed for each digitized component signal sequentially, the method further comprising:
storing the shaped, frequency-shifted digitized component signals until the stored digitized component signals represent the entire frequency band of interest, wherein the summing the digitized component signals comprises summing the stored digitized component signals representing the entire frequency band of interest.

6. The method of claim 1, further comprising:
storing a plurality of digitized component signals; and
performing the shaping and frequency-shifting for the stored plurality of digitized component signals in parallel, using a plurality of signal processing paths.

7. The method of claim 1, further comprising aligning the digitized component signals in time by beginning the digitizing of each frequency subset at a fixed time relative to a repetition of the received signal.

8. An apparatus for representing a finite time period of a frequency band of interest of a repeating received signal, the apparatus comprising:
a receiving device configured to sequentially digitize a plurality of frequency subsets of the frequency band of interest to generate a respective plurality of digitized component signals, each frequency subset based on a respective repetition of the received signal, each frequency subset having a respective center frequency with a respective frequency offset from a center frequency of the frequency band of interest, and each frequency subset having at least one overlap portion constituting a region of frequency overlap with another frequency subset;
a summing device configured to sum the digitized component signals to obtain a composite signal having a composite frequency band;
at least one digital filter configured to filter the digitized component signals, prior to the summing, wherein the at least one digital filter has a reduced gain in at least a portion of the overlap portions to reduce artificial increases in magnitude in the composite signal within the overlap portions; and
at least one frequency-shift device configured to frequency-shift each digitized component signal, prior to the summing, by the respective frequency offset of the respective subset of the frequency band of interest.

9. The apparatus of claim 8, further comprising:
at least one adjustment device configured to adjust, prior to the summing, at least one of gain, phase, and time delay of one or more of the digitized component signals such that the sum of the digitized component signals has a continuous frequency response over the composite frequency band.

10. The apparatus of claim 9, wherein, in adjusting the time delay of one or more of the digitized component signals, the at least one adjustment device is configured to determine a time offset between two or more of the digitized component signals by correlating instantaneous power signatures of the two or more of the digitized component signals.

11. The apparatus of claim 10, wherein correlating instantaneous power signatures of two of the digitized component signals comprises filtering out portions of the two of the digitized component signals that are outside an overlap portion of the two of the digitized component signals.

12. The apparatus of claim 9, further comprising:
a power-level trigger configured to:
identify a transition from low power on the received signal to high power on the repeating received signal; and
wherein the at least one adjustment device is further configured to:
determine a time offset between two or more of the digitized component signals by determining a difference in time between the occurrence of the transition in the two or more of the digitized component signals; and
adjust the time delay of one or more of the digitized component signals to remove the time offset between the two or more of the digitized component signals.

13. The apparatus of claim 8, further comprising:
an interpolation device configured to interpolate, prior to the summing, the digitized component signals to at least a Nyquist rate of the digitized component signals.

14. The apparatus of claim 8, wherein the filtering and frequency-shifting are performed for each digitized component signal sequentially, the apparatus further comprising:
at least one memory configured to store the filtered, frequency-shifted digitized component signals until the stored digitized component signals represent the entire frequency band of interest, wherein, in summing the digitized component signals, the summing device is configured to sum the stored digitized component signals representing the entire frequency band of interest.

15. The apparatus of claim 8, further comprising:
at least one memory configured to store a plurality of digitized component signals;
wherein the at least one filter comprises a plurality of filters arranged as a plurality of parallel signal processing paths, wherein each of the plurality of filters is configured to concurrently filter one of the stored digitized component signals; and
wherein the at least one frequency-shift device comprises a plurality of frequency-shift devices arranged in the plurality of parallel signal processing paths, wherein each of the plurality of frequency-shift devices is configured to concurrently filter one of the stored digitized component signals.

16. The apparatus of claim 8, wherein the receiving device has a real-time instantaneous bandwidth that is less than the instantaneous bandwidth of the frequency band of interest.

17. An apparatus for representing a finite time period of a frequency band of interest of a repeating received signal, the apparatus comprising:
a memory configured to store a plurality of digitized component signals, each of the digitized component signal representing a digital representation of a frequency subset of a frequency band of interest of a repeating signal, each frequency subset based on a respective repetition of the repeating signal, each frequency subset having a respective center frequency with a respective frequency offset from a center frequency of the frequency band of interest, and each frequency subset having at least one overlap portion constituting a region of frequency overlap with another frequency subset;

a summing device configured to sum the digitized component signals to obtain a composite signal having a composite frequency band representing at least the frequency band of interest; and a plurality of signal processing paths, each signal processing path comprising:
  a digital filter configured to filter a respective digitized component signal, prior to the summing, the digital filter having a reduced gain in at least a portion of the overlap portions to reduce artificial increases in magnitude in the composite signal within the overlap portions; and
  a frequency-shift device configured to frequency-shift a respective digitized component signal, prior to the summing, by the respective frequency offset of the respective subset of the frequency band of interest.

18. The apparatus of claim 17, wherein each signal processing path of the plurality of signal processing paths further comprises:
  an adjustment device configured to adjust, prior to the summing, at least one of gain, phase, and time delay of a respective digitized component signal such that the sum of the digitized component signals has a continuous frequency response over the composite frequency band.

19. The apparatus of claim 18, wherein, in adjusting the time delay of the respective digitized component signal, the adjustment device is configured to determine a time offset between the respective digitized component signal and an other digitized component signal of the plurality of digitized component signals by correlating instantaneous power signatures of the respective digitized component signal and the other digitized component signal.

20. The apparatus of claim 17, wherein each signal processing path of the plurality of signal processing paths further comprises:
  an interpolation device configured to interpolate, prior to the summing, a respective digitized component signal to at least a Nyquist rate of the digitized component signals.

* * * * *